United States Patent [19]
Lafrance

[11] 4,386,320
[45] May 31, 1983

[54] X-RAY SYSTEM SIGNAL DERIVATION CIRCUITS FOR HEAT UNIT INDICATORS AND/OR CALIBRATION METERS

[76] Inventor: Robert R. Lafrance, St. Malo, Canada

[21] Appl. No.: 287,202

[22] Filed: Jul. 27, 1981

Related U.S. Application Data

[63] Continuation-in-part of Ser. No. 71,252, Aug. 30, 1979, Pat. No. 4,297,638, which is a continuation-in-part of Ser. No. 914,504, Jun. 12, 1978, abandoned.

[51] Int. Cl.[3] .......... G01R 31/024
[52] U.S. Cl. .......... 324/410; 324/402; 324/409; 378/101; 378/117
[58] Field of Search .......... 250/408-410, 250/402; 324/403, 405, 408-410

[56] References Cited

U.S. PATENT DOCUMENTS

| | | | |
|---|---|---|---|
| 3,770,963 | 11/1973 | Keith | 250/409 |
| 3,842,280 | 10/1974 | Herrick | 250/409 |
| 3,939,352 | 2/1976 | Mester | 250/409 |
| 3,974,385 | 8/1976 | Grim | 250/402 |

*Primary Examiner*—Michael J. Tokar
*Attorney, Agent, or Firm*—Stanley G. Ade

[57] ABSTRACT

Signal as the milliampere and/or kilovolt signals are monitored from the X-ray tube system via the high tension transformer thereof. These signals may be connected to a heat unit indicator or a calibration meter or both. With the heat unit indicator, the heat level in an X-ray tube anode is monitored and referred to the level corresponding to the ambient room temperature as zero reference. As successive single exposures or series of exposure are made, the X-ray tube heat loading is automatically monitored and displayed so that the operator is aware of the situation at all times. The cooling characteristics of the tube are automatically taken into account and reflected in the reading. If desired, a calibration meter may be connected to the signal derivation circuitry to measure and indicate readily and easily, a plurality of operating parameters. The circuitry optionally includes an automatic scaling device or other provisions, for maintaining the relatively accurate signals required for the accurate operation of the heat unit indicator and the calibration meter. This device may be in the form of an individual instrument module connectable to any X-ray machine for monitoring KV waveforms.

46 Claims, 16 Drawing Figures

POWER SUPPLY, SIGNAL DERIVING & ISOLATION MODULE

POWER SUPPLY, SIGNAL DERIVING & ISOLATION MODULE

X-RAY SYSTEM SIGNAL DERIVATION CIRCUITS FOR HEAT UNIT INDICATORS AND/OR CALIBRATION METERS

BACKGROUND OF THE INVENTION

This invention relates to new and useful improvements for protecting and prolonging the life of X-ray tubes and constitutes a continuation-in-part of U.S. application Ser. No. 071,252 filed Aug. 30th, 1979, now U.S. Pat. No. 4,297,638 which in turn is a continuation-in-part application of U.S. application Ser. No. 914,504, filed June 12th, 1978 (now abandoned).

The invention also relates to new and useful improvements in signal derivation circuits from X-ray control systems. Specifically, it consists of a power supply and a milliampere module together with a kilovolt module which monitors the primary volts of the high tension transformer as well as the milliamps flowing through mid-secondary of the high tension transformer. The outputs of these modules are proportional to the KV and MA respectively and are also electrically isolated from the high tension transformer circuitry.

Once these signals have been derived, they can be used either to operate an X-ray heat unit indicator/controller or a calibration meter or both.

If used as a heat unit indicator/controller, the system provides a flexible, safe, accurate device for assuring operation of X-ray tubes within the anode heat ratings, thereby protecting them and helping to extend the life thereof.

If used to operate a calibration meter, it enables the operator to check on all important aspects of radiographic exposure levels so that if drifting or inaccuracies appear, they can be found readily and easily and corrected before damage is done to the equipment; it also provides an agency to minimize the need for repeated exposures of patients attributable to loss of calibration.

The device is also particularly suitable for use as an independent instrument module for detachable or permanent attachment to an X-ray system for simulating, with reasonable accuracy, a KV signal proportional to the KV signal across an X-ray tube during an X-ray exposure.

It should be understood that one of the difficulties in operating X-ray equipment is monitoring the heat build up which occurs at the anode of the tube, particularly with the equipment being used on a relatively continuous basis.

If the anode heat exceeds a safe level, tube life is reduced considerably and in fact the tube may be destroyed if it is used above the predetermined safe heat level.

The present equipment, when used with a heat unit indicator, continually monitors this heat build up and also monitors the natural cooling that takes place so that the operator can ascertain the heat level at all times. Interlock switches can be incorporated which inhibit X-ray exposures if a predetermined heat level is reached.

Dealing first with the X-ray heat unit indicator/controller it is a flexible, safe, accurate device for assuring operation of X-ray tubes within the anode heat ratings, thereby protecting them and helping extend life.

The device can be used with any manufacturer's X-ray tubes in any X-ray system, including different tubes in the same system and can, if desired, handle a multiplicity of tubes operated from the same control. Modular construction enables economical matching of capability to system configuration.

In operation, the device monitors the heat level in the X-ray tube anode, referred to the level at room ambient temperature as zero reference. As successive single exposures or series of exposures are made with a given tube, its anode heat loading is automatically monitored and displayed on a 0–100 percent scale, on an analog or a digital display. The cooling characteristic of the tube is automatically taken into account and reflected in the reading; this function incorporates a non-volatile memory which operates whether or not X-ray system power or the power to the device is on all the time.

A typical installation incorporates two main units. An input signal assembly is close to the high tension transformer, where signals are picked off from the primary in a single-phase system (or the respective primaries for a 3-phase power supply), and from the mid-secondary connection(s). No contact with actual high tension points is necessary. In multi-tube systems, the position of the high voltage selector switch is also monitored at this location, to establish the specific tube selected by the operator for use. From here, only low level signals are remoted to a display assembly, which is located preferably at the X-ray control console. Optional remote displays slaved to the main display can be mounted at the respective tube heads, for the convenience of the operating personnel if desired. The display assembly incorporates a set of indicators such as an LED to show which tube has been selected; similarly, each remote display may include a LED indicator or the like to signal when its tube had been selected.

Beyond the anode heat status display, the device protects tubes, by additional features, from damage due both to excessive exposure magnitude, when the anode is under temperature, and to further exposure when maximum acceptable heat capacity is reached. Cold anode protection may be provided by closing a set of isolated relay contacts when the anode heat units reach a selectable point from 0 percent (room temperature ambient conditions) to, for example, a nominal 40 percent. This facility may be used by the service personnel to lock out high MA stations during warm up until adequate heat loading of the anode has been reached: this applies both at start up and after idle times when the tube has cooled down below a preset minimum level eg. 10%.

Similarly, two additional functions may be incorporated to provide anode overheat protection. Another set of isolated relay contacts are opened when the 100 percent heat unit level is reached; again, this may be used to inhibit system operation. Furthermore, to assure continuity in operation, an adjustable threshold can be set between, for example, the 75 and 95 percent points: if the set heat unit loading is passed in the course of an exposure, that exposure is permitted to go to completion without cutoff so long as it preferably does not go past the 100 percent point, but subsequent exposures can be locked out until the tube cools below the set point.

For each tube, the display assembly preferably includes a group of three LED indicators, which function regardless of the use of the interlock features, to signal the cold anode, caution hot anode, and 100% anode heat load conditions.

Secondly a calibration meter may be connected to the signal derivation circuits either separate or in conjunction with the Heat Unit Indicator. This meter can measure and indicate a plurality of operating parameters as will hereinafter be described. In either case, relatively accurate signals are required and in this connection an Auto Scaling device may be incorporated.

SUMMARY OF THE INVENTION

According to the present invention there is provided signal derivation circuits for X-ray tubes, said tubes including a high tension transformer having a secondary winding and a primary winding, said signal derivation circuits comprising in combination a milliampere circuit operatively connected to the mid point of the secondary winding of the high tension transformer thereby providing a signal that is proportional to the milliamperes flowing through said mid-secondary winding, and a kilovolt circuit operatively connected to the primary voltage on the high tension transformer thereby providing, in conjunction with a load compensation signal derived from said milliampere circuit, a signal proportional to the kilovoltage across the X-ray tube and a multiplier circuit operatively connected to said milliampere circuit and said kilovolt circuit.

With the foregoing in view, and other advantages as will become apparent to those skilled in the art to which this invention relates as this specification proceeds, the invention is herein described by reference to the accompanying drawings forming a part hereof, which includes a description of the preferred typical embodiment of the principles of the present invention, in which:

DESCRIPTION OF THE DRAWINGS

In the drawings like characters of reference indicate corresponding parts in the different figures.

DETAILED DESCRIPTION

Proceeding therefore to describe the invention in detail, reference should first be made to Module #1 (FIG. 1)—power supplies, signal derivation and isolation module. The functions of Module #1 are:

(A) To provide all the low voltage power supply requirements for the total system consisting of #1 Module, #2 Module and #3 Module. This is accomplished by Block S6 and Block S5.

(B) To derive a signal proportional to but isolated from the current (MA) flowing through the X-ray tube in use during an X-ray exposure. This is accomplished by Block S7 and Block S2, in conjunction with Block S1.

(C) To derive a signal proportional to, but isolated from, the kilovoltage (KV) appearing across the X-ray tube in use during an X-ray exposure. This is accomplished by Block S8, Block S4 and Block S3 in conjunction with Block S1.

NOTE: the following functions of Module 190 1 are relevant only when Module #1 will be used in conjunction with Module #2 (Heat Unit Indicator).

(D) To translate and isolate the Housing Temperature signals coming from the X-ray Tube Housing Temperature Sensor(s). This is accomplished by Block H1.

(E) To translate and isolate the tube Select signals coming from the X-ray control's High Tension Switching circuits. This is assomplished by Block H2.

(F) To provide safe and electrically isolated means of inhibiting X-ray exposures when the selected X-ray Tube Heat Status (either Anode or Housing Heat Status) is not within safe operating limits. This is accomplished by Block H3.

(G) To translate the isolated Rotor Speed Signal (High speed or Standard speed) and Focal Spot Size (large or small) coming from X-ray control system. This is accomplished by Block H4.

Figure 2:
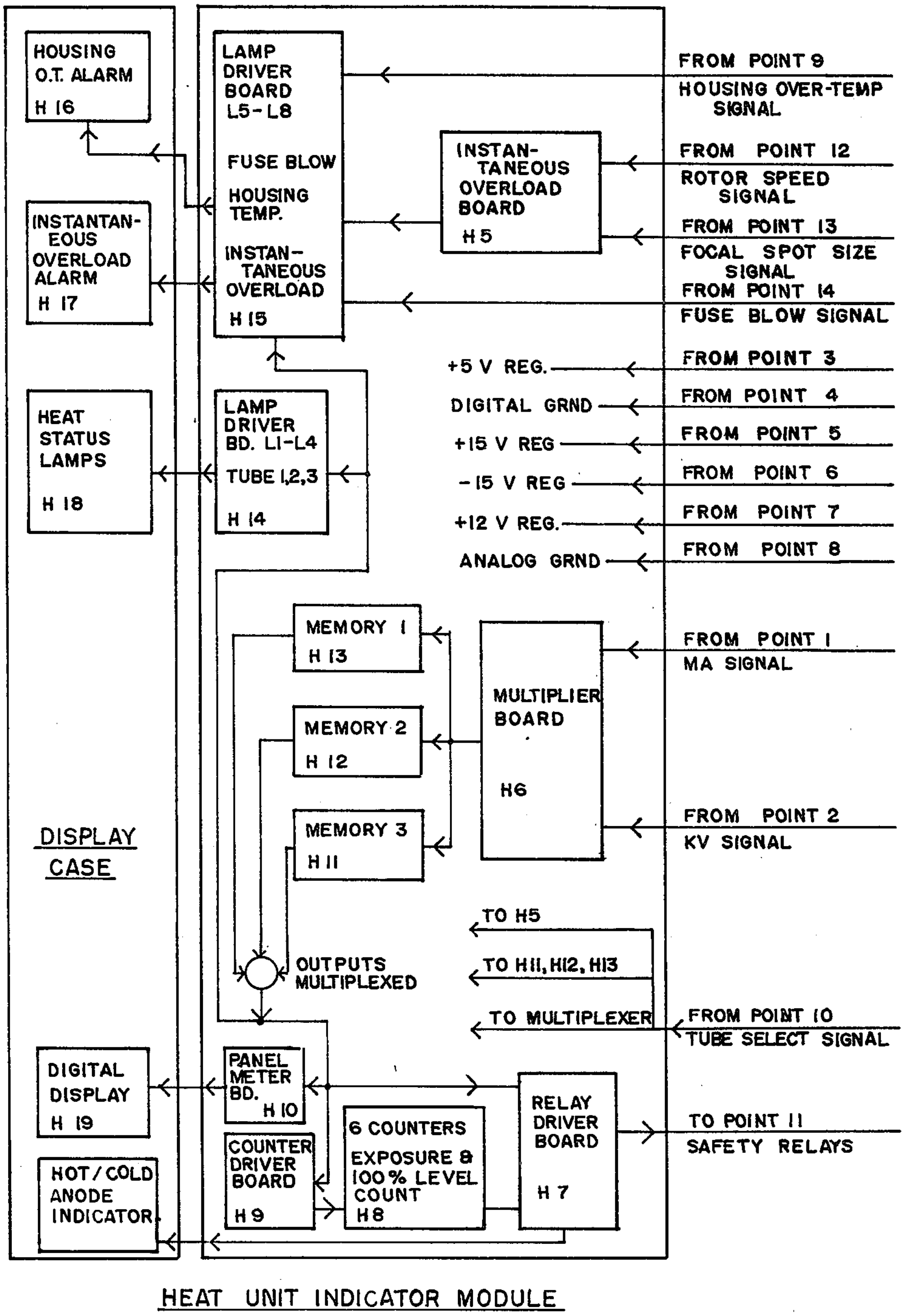
FIG. 2 is a block diagram of the Heat Unit Indicator module.

Module #2 (FIG. 2) Heat Unit Indicator Module

This module was designed to afford the maximum protection to the X-ray tube(s) within an X-ray control system.

This module will offer protection to the X-ray tube(s) in several different ways as outlined below (refer to FIG. 2):

(A) Will recognize when the X-ray tube in use has reached its maximum allowable Housing Temperature. It will then give a visible and or an audible alarm. This is accomplished by Block H1 (FIG. 1), Block H15 and Block H16.

Figure 1:
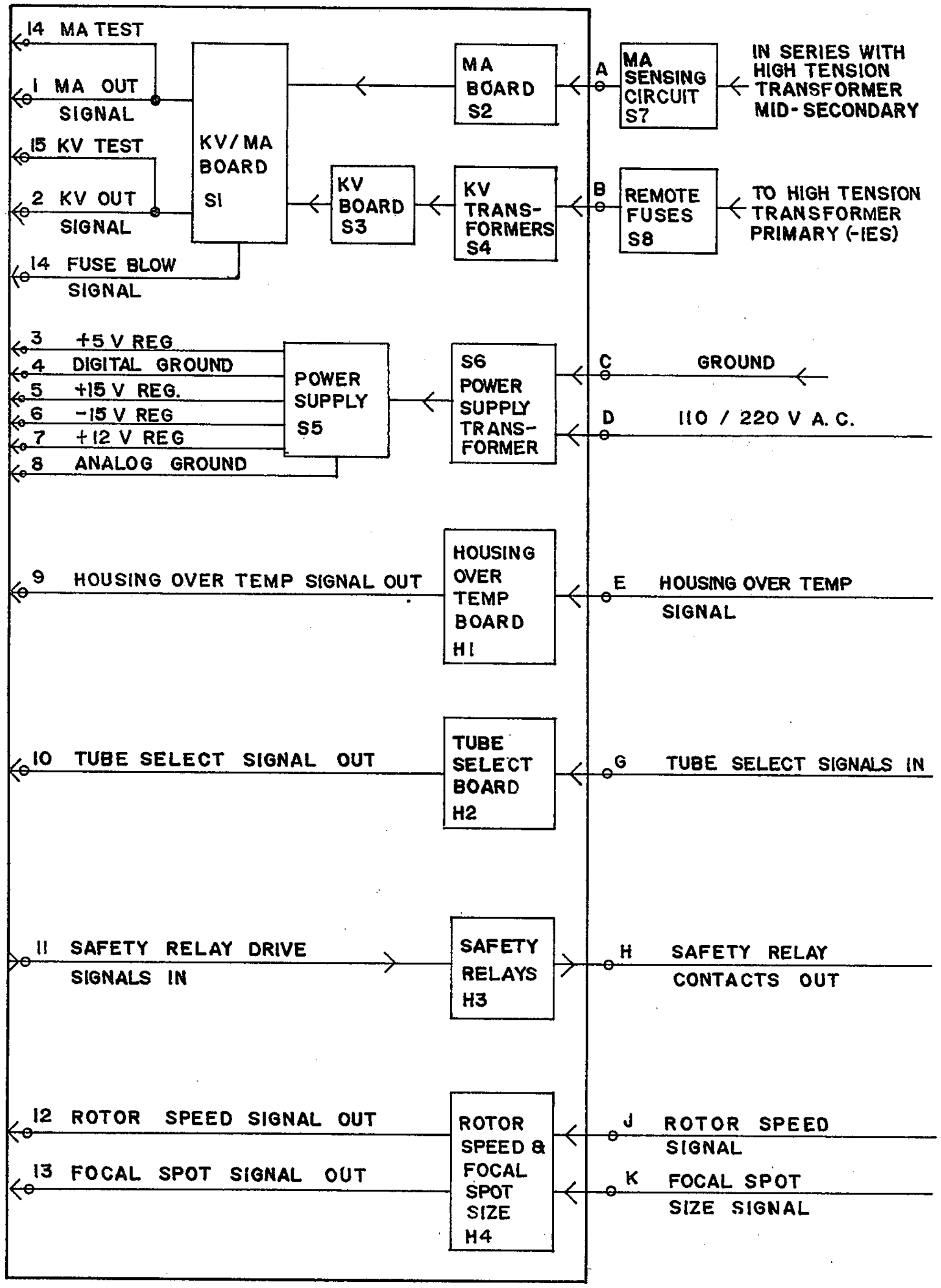
FIG. 1 is a block diagram of the power supply, signal derivation and isolation module.

(B) Will recognize when the surface of the X-ray tube anode in use has reached its maximum permissible level (surface temperature or differential temperature of surface to average temperature of the anode). Will then give a visible and/or an audible alarm. This alarm gives the operator an indication that the single exposure ratings of the X-ray tube in use have been exceeded, and that the X-ray control system's calibration and single exposure safety circuits should be checked by qualified service personnel. This is accomplished by Blocks H17, H15, and H5 in conjunction with Blocks H2 (FIG. 1), and H4 (FIG. 1).

(C) Will recognize when anode is cold (below nominal 10%) and will demand warm-up temperature threshold (nominal 40% H.U.). Will then allow maximum allowable single exposures until such time as the tube anode cools below cold anode threshold (monimal 10%). Will remember if the tube in use has had proper warm-up even if power is interrupted. This is accomplished by Blocks H13, H12 and H11 in conjunction with Block H2 (FIG. 1).

(D) Will accumulate and store the heat units or kilowatts that are delivered to the anode of the X-ray tube in use and simultaneously will simulate the natural heat dissipation or cooling of that particular X-ray tube's anode. Will have the capability of keeping track of the Anode Heat Status of up to three different X-ray tube anodes at the same time. Will have the capability of simulating the natural cooling of the X-ray tube anode(s) even if power is interrupted. This is accomplished by Block H6, H13, H12, H11 and Block H2 of 190 1 Module.

(E) Will display the Anode Heat Unit Status of the X-ray tube in use in an analogue fashion. This is accomplished by Blocks H11, H12, and H13 in conjunction with Blocks H14, H18, and H2 of #1 Module.

(F) Will display the Anode Heat Unit Status of the X-ray tube in use in a digital fashion. This is accomplished by Blocks H11, H12, H13, H10 and H19.

(G) Will count the total number of exposures taken on each X-ray tube respectively (up to three different tubes). This is accomplished with Blocks H11, H12, H13, H9, H8 and H2 of #1 Module.

(H) Will count the total number of exposures taken on each X-ray tube respectively during overload conditions (up to three different tubes). This is accomplished by Blocks H11, H12, H13, H9, H8 and H2 of #1 Module.

Figure 3:
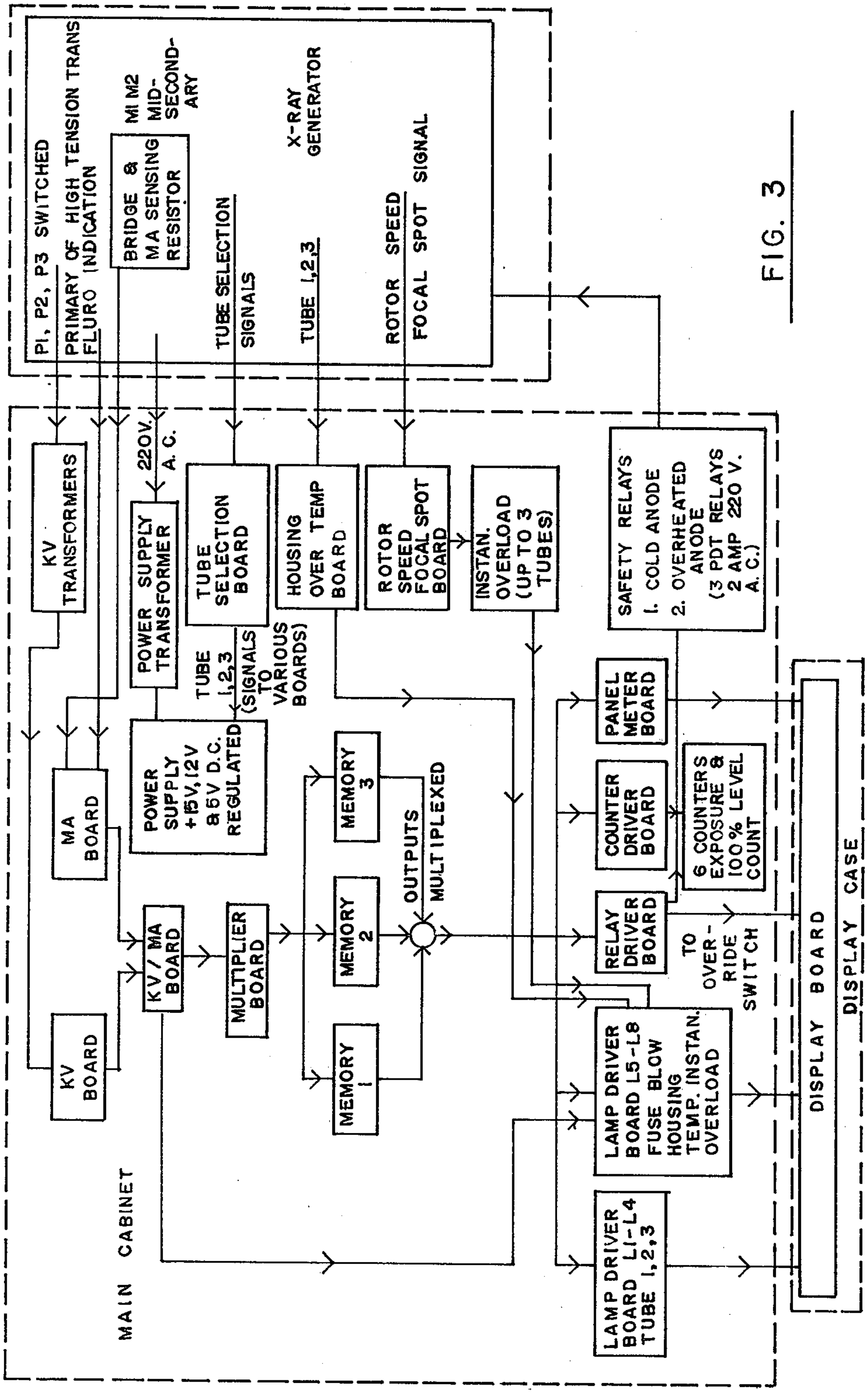
FIG. 3 is a block diagram of the preferred embodiment of the Heat Unit Indicator module.

FIG. 3 shows a block diagram of Module #1 in conjunction with Module #2 forming a Heat Unit Indicator System.

Figure 4:
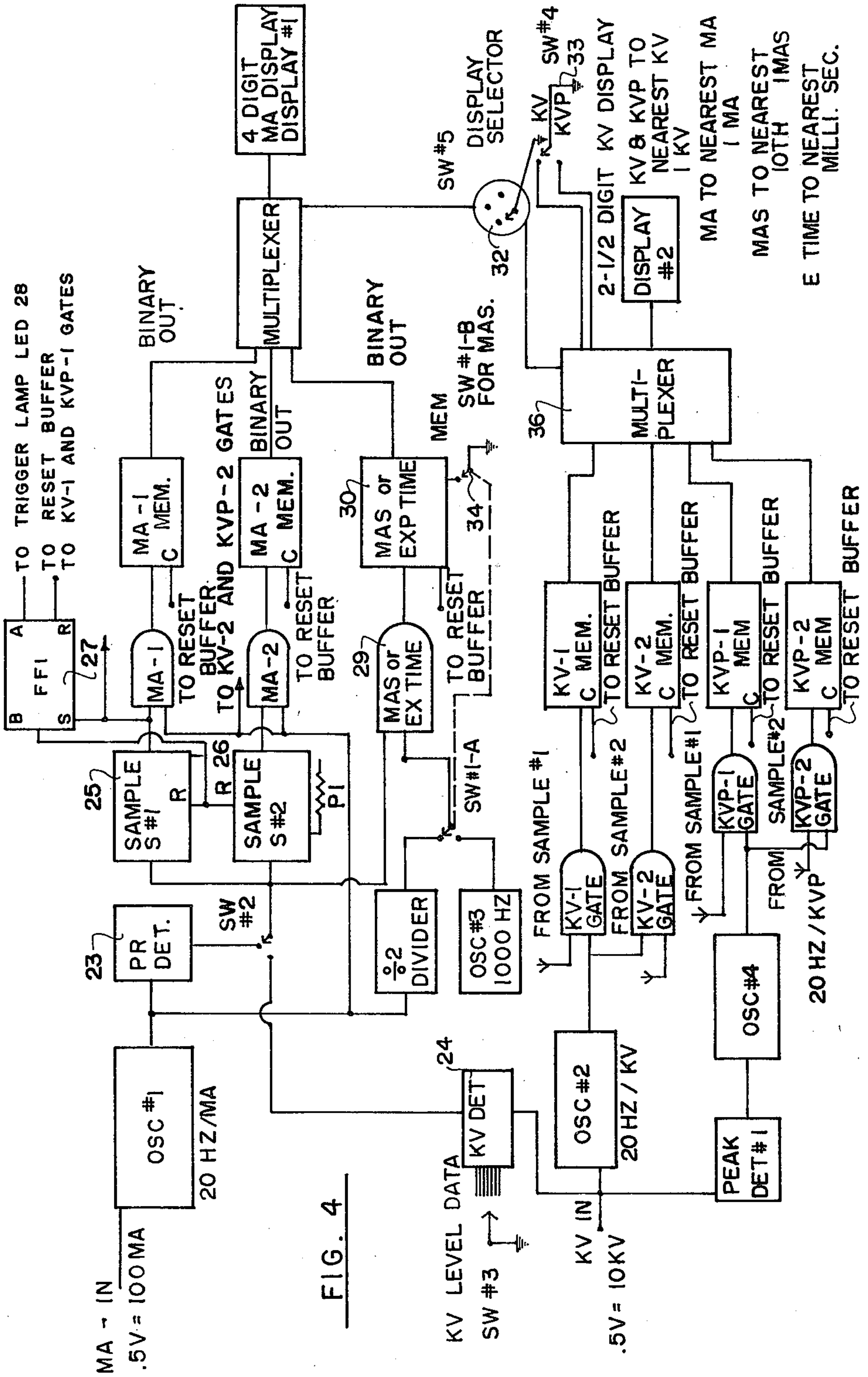
FIG. 4 is a block diagram of the calibration meter circuit.

Block Diagram Description of Calibration Meter—Module #3 (FIG. 4)

The values given are exemplary only.

(A) Oscillator #1—This is a voltage to frequency converter. Since Oscillator #1's input is the MA signal from the H.U.I.'s KV-MA board, the output pulse rate of Oscillator #1 is directly proportional to the MA input signal.

In this example,

Pulse Rate=20 HZ per MA (1 MA in=20 HZ) (1000 MA in=20 KHZ)

(B) Oscillator #2—This is a voltage to frequency converter. Since Oscillator #2's input is the KV signal from the H.U.I. KV-MA board, the output pulse rate of Oscillator #2 is directly proportional to the input KV signal.

In this example, Pulse Rate=20 HZ per KV
(10 KV=200 HZ)
(100 KV=2 KHZ)

(C) Peak Detector #1—This device is used to derive the peak KV signal that appears at KV-IN input.

(D) Oscillator #4—This is a voltage to frequency converter. Since the input voltage to Oscillator #4 is proportional to the peak value of the KV signal (because of Peak Detector #1) the Output Pulse Rate is directly proportional to peak KV signal.

In this example, Pulse Rate=20 HZ/KVP
(10 KVP=200 HZ)
(100 KVP=2 KHZ)

(E) Oscillator #3—This is a 1 KHZ fixed frequency oscillator. 1000 Pulses/Second in this embodiment.

NOTE: The KV, KVP and MA signals have now been changed to a digital form.

| | |
|---|---|
| (MA = 20 HZ/MA (Oscillator #1))<br>(KV = 20 HZ/KV (Oscillator #2))<br>(KVP = 20 HZ/KVP (Oscillator #4))<br>(Time - 1 KHZ (Oscillator #3)) | An acceptable, typical set of conversion values. |

Trigger Detection (A) Pulse Rate Detector—This device 23 looks at the MA output pulses from Oscillator #1, and when the pulse rate from Oscillator #1 is greater than 200 HZ the output of this device will go high and remain high until the pulse rate goes below 200 HZ.

(B) KV Detector and Switch #3—This device 24 will produce a high output when the KV input at (KV-IN) exceeds a preset threshold set by Switch #3. Switch #3 sets KV threshold in 10 KV increments.

NOTE: A calibrated potentiometer could be used instead of Switch #3 if desired.

(C) Switch #2—Switch #2 will be used to select the trigger mode (KV Trigger or MA Trigger).

Sample Timing (A) Sample #1 Circuit 25—This circuit will put out a single 50 MS output pulse when triggered by PR Detector 23 or KV Detector 24.

(B) Sample #2 Circuit 26—This circuit will put out a single 50 MS output pulse at anywhere from 25 MS to 125 MS after Sample #1 timer has initiated its pulse. The time delay between Sample #1 output and Sample #2 output is adjustable by delay potentiometer P1.

(C) Flip Flop #1 (27)—Flip Flop #1 is set when Sample #1 timer has initiated its output pulse. When Flip Flop #1 is set, its output "A" turns on a trigger indication LED 28 situated on the front panel of the calibration meter. This LED indicates that the sample timers have triggered. When Flip Flop #1 gets a reset pulse from reset buffer, output "B" of Flip Flop #1 gives out a low output pulse that resets Sample #1 and Sample #2 timers.

MA Sampling

Instantaneous MA Sampling:

MA 1 Gate and MA 1 Memory

When a radiographic exposure is initiated, a signal proportional to MA appears at MA-IN input 28, and a signal proportional to KV appears at KV-IN input 29, and Sample #1 timer initiates an output pulse which is directed to MA 1 Gate. The other input to MA-1 Gate is the output pulse at Oscillator #1 (20 HZ per MA). Oscillator #1's output pulse will be allowed to go through AM-1 Gate only as long as Sample #1's output pulse is present at the input at the MA-1 Gate. The pulses out of MA-1 Gate are led into MA-1 Memory. MA-1 Memory will record the number of MA pulses that appeared at the output of MA-1 Gate during Sample #1 time.

For example: 100 MA at MA-IN

Oscillator #1 Pulse Rate=100 MA×20 HZ/MA=2000 HZ

Number of pulses appearing at MA-1 Gate output for Sample #1

Duration=Sample Time×Pulse Rate=2000×0.05=100 pulses

Therefore the number of pulses stored in MA-1 Memory is directly proportional to the RMS MA that appeared at MA-IN input during Sample Time #1.

The digital accuracy of the memory is ±1 digit or ±1 MA.

MA 2 Gate and MA 2 Memory

The delayed MA sampling functions are the same as the instantaneous MA with the exception that the MA is being sampled sometime after the radiographic exposure has started e.g., 25–125 MS after exposure has started.

It should be pointed out at this time that an MA signal at the MA-IN input has to be present for at least as long as the sample timers are putting out their respective sample pulses.

For the instantaneous MA, an exposure time of at least 60–70 MS is required.

For the delay MA, an exposure time of at least 90 MS to 200 MS is required depending on the amount of delay set before sampling.

MAS Circuit or Exposure Time Circuit

÷2 Divider—This circuit divides the output pulse rate from Oscillator #1 by two. Therefore, the output pulse rate at ÷2 Divider is 10 HZ/MA.

MAS Mode—During the MAS Mode of operation, the output pulses at the ÷2 Divider circuit are routed to one input of the MAS or Exposure Time Gate 29 via Switch #1-A. The other input of Gate 29 is routed to either the PR Detector or the KV Detector output, depending on the position of Switch #2. Therefore, whenever MA-IN is greater than 10 MA in the MA trigger mode, or the KV-IN exceeds the selected threshold of the KV Detector in the KV trigger mode, the output pulses of the ÷2 Divider will pass through Switch #1-A to Gate 29, and then to the input of the MAS or Exposure Time Memory circuit 30. Memory 30 counts and stores the number of pulses that appear at its input. Since the output pulses at the ÷2 Divider are 10 HZ/MA, each one of the MAS Pulses stored in Memory 30 is equal to 0.1 MAS.

For example, 100 MA Exposure for 1 Second yields

100 MA×1 second=100 MAS=1000 HZ×1 second=1000 pulses.

1 pulse=0.1 MAS, therfore 1000 pulses=100 MAS

The digital accuracy of the MAS circuit is ±1 Pulse or ±1/10 MAS.

Exposure Time Mode—In this mode of operation, one input of the MAS or Exposure Time Gate 29 is routed to Oscillator #3 via Switch #1-A. The output pulse rate of Oscillator #3 is 1000 HZ.

The other input of MAS or Exposure Time Gate 29 is still being fed by PR Detector 23 for inputs of 10 MA or over, or by the KV Detector 24 (with selectable threshold). Therefore, the output pulses from Oscillator #3 will be allowed to pass through the MAS Exposure Time Gate for either of these two conditions. These pulses are counted and stored in the MAS or Exposure Time Memory 30.

Since the output rate of Oscillator #3 is 1000/second, each pulse stored in the memory 30 is equivalent to 1 MS of Exposure Time.

For example (1 second exposure):

1 second×1000 HZ−1000 pulses=1000 MS or 1.000 second.

The digital accuracy is ±1 Pulse or ±1 Millisecond.

KV (RMS) Sampling

Instantaneous KV Sampling:

KV-1 Gate

One input at KV-1 Gate is the output pulses from Oscillator #2.

The other input to KV-1 Gate is the output of Sample #1 Timer (single 50 MS pulse).

Since the output pulse rate from Oscillator #2 is directly proportional to the KV-IN input, and the KV-1 Gate only allows these pulses through for 50 MS=Sample #1 Time, the number of pulses appearing at the input of KV-1 Memory is directly proportional to the KV signal at the beginning of a radiographic exposure.

For example, 100 KV=2000 HZ pulse Rate

Number of Pulses=2000×0.05 Second=100 pulses

Digital accuracy=±1 Pulse=±1 KV

Delayed KV Sampling:

This circuit operates identically to the Instantaneous KV Sampling circuit with the exception that the KV is being sampled after a time delay (Sample #2 Timer).

KVP Sampling

Instantaneous KVP Sampling:

One of the inputs to the KVP-1 Gate is the output pulses from Oscillator #4.

The pulse rate output of Oscillator #4 is directly proportional to the peak signal appearing at the KV-IN input, as previously explained.

The other input to the KVP-1 Gate comes from the Sample #1 Timer.

Therefore, the KVP-1 Gate will only allow the output pulses from Oscillator #4 to reach the KVP-1 Memory for the 50 MS duration of the Sample #1 pulse.

Since the pulse rate of Oscillator #4 is proportional to the peak of the KV signal at KV-IN and the sample time is 50 MS, the number of pulses reaching the KVP-1 Memory is directly proportional to KVP, during the sampling time. For example, 100 KVP=2000 HZ Pulse Rate;

2000 HZ×0.05=100 Pulses.

The digital accuracy is ±1 Pulse or ±1 KVP.

Delayed KVP Sampling:

This KVP-2 circuit operates in the same manner as the Instantaneous KVP Sampling with the exception that the KVP is being sampled after a time delay (set by Sample Timer #2).

Display Selection:

(A) There are two digital displays on the front panel of the Calibration check meter.

Diplay #1—4 digits, displays one of three memories (MA-1 or MA-2 or MAS or Exposure Time).

Display #2—2½ digits, displays one of four memories (KV-1 or KV-2 or KVP-1 or KVP-2).

(B) The Multiplexer circuit 31 in conjunction with the display selector 32 will choose which piece of stored information will be displayed on Display #1. Similarly, the Multiplexer 36 will direct signals to Display #2.

1. A main 3-position Switch #5 (32) will determine what stored information will be displayed.
   Position #1 —Sample #1 mode.
   Position #2 —Sample #2 mode.
   Position #3 —MAS or Exposure Time mode.
2. A second switch (2-position)—Switch #4 (33) will determine whether the KVP or the KV (RMS) will be displayed (note the Truth Table).
3. Switch #1 (34) will determine whether the MAS or Exposure Time Memory will have MAS or exposure time stored in it. This switch also sets scale factors.

appear at the output of the isolation amplifier points 9 and 10.

The output signal point 9 is negative going with respect to ground potential.

The purpose of IC-1 is to invert this signal and to drive the MA current source transistor T1.

Since the negative feedback for IC-1 is taken from the top of R3, through R2 to the inverting input of IC-1, the voltage drop across R3 is directly proportional to but of opposite polarity to the signal appearing at point 9. Therefore, the collector current of MA current source transistor T1 is also directly proportional to the signal at point 9. The collector current of T1 will be used to simulate the X-ray tube current in the KV deriving circuits as will hereinafter be described.

DISPLAY TRUTH TABLE

| SWITCH #5(32) | SWITCH #4(33) | DISPLAY #1(29) | DISPLAY #2(30) |
|---|---|---|---|
| Position 1 (Sample 1) | KVP | MA-1 | KVP-1 |
| Position 1 (Sample 1) | KV(RMS) | MA-1 | KV(RMS)-1 |
| Position 2 (Sample 2) | KVP | MA-2 | KVP-2 |
| Position 2 (Sample 2) | KV(RMS) | MA-2 | KV(RMS)-2 |
| Position 3 (MAS Exposure Time) | KVP | MAS or Exposure Time (selectable) | KVP-1 |
| Position 3 (MAS Exposure Time) | KV(RMS) | MAS or Exposure Time (selectable) | KV(RMS)-1 |

NOTE: Instead of a KV-KVP switch 33 an alternate method would be to only display the (KV-RMS) as a percentage of the peak KV. This would be a two-digit display indicating from 0 to 99%. This would give a good idea of the KV wave shape and the amount of ripple on the KV wave form.

Figure 11:
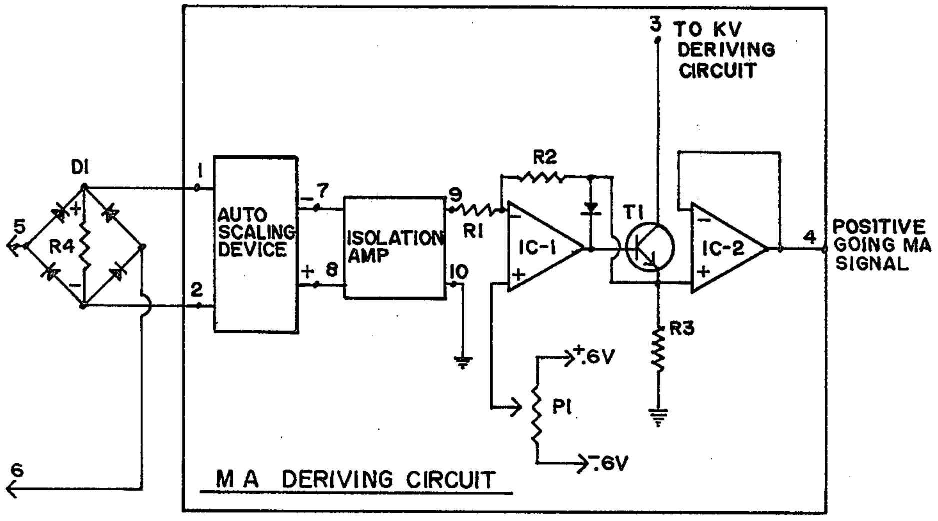
FIG. 11 is a schematic diagram of the MA deriving circuit.

FIG. 11 shows a schematic diagram of a preferred method of deriving an MA signal that is proportional to but electrically isolated from the current flowing through the X-ray tube during an X-ray exposure.

Circuit Description of FIG. 11

Points 5 and 6 are inserted in series with the X-ray system's High Tension Mid-secondary circuit such that any electrical current flowing through said High Tension Mid-secondary has to flow through point 5, through full wave bridge rectifier D1, through MA sensing resistor R4 and out through point 6. Full wave bridge D1 is used to rectify the current flowing through points 5 and 6 and allow the said current to flow through MA sense resistor R4 in only one direction. Therefore, the DC voltage drop across MA sense resistor R4 is directly proportional to the current flowing through the High Tension Mid-secondary circuit of the X-ray system.

The signal across R4 is then connected to an Auto Scaling device through points 1 and 2. The Auto Scaling device will automatically extend the dynamic range of the MA deriving circuits, as will hereinafter be described.

The signal from the Auto Scaling device is then connected to the isolation amplifier through point 7 and point 8.

The purpose of the isolation amplifier is to electrically isolate the differential signal across point 7 and point 8 and to produce a ground referenced signal proportional to but isolated from said differential signal. The reproduced, ground referenced signal will then The signal appearing across R3 is amplified by IC-2 and the output of IC-2 represents the MA signal. This signal is then used by the multiplier circuit (if heat unit indicator is incorporated), and or by the calibration meter when it is used.

In order to assure the necessary accuracy of the derived signals, an Automatic Scaling device forms part of the front end of the isolation amplifier 21 shown in FIG. 11.

Figure 6:
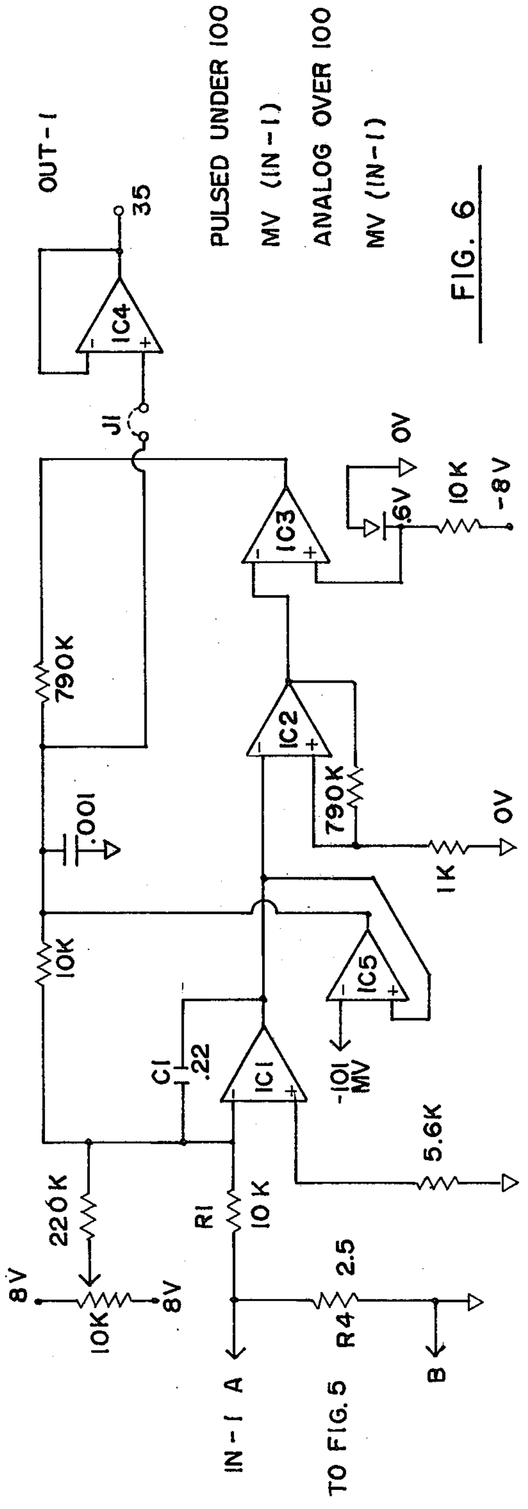
FIG. 6 is a schematic diagram of the Auto Scaling device.

FIG. 6 shows the schematic diagram of the scaling device.

Figure 5:
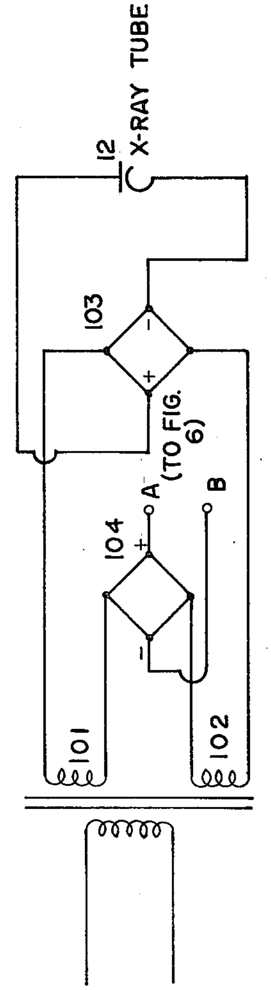
FIG. 5 is a schematic diagram showing the connection between the high tension mid-secondary to the Auto Scaling device.

General Operation of Auto Scaling Pulsed Operation - referring to FIGS. 5 and 6

FIG. 5 shows a simplified X-ray tube high tension circuit in which 12 depicts the X-ray tube. The cathode of 12 is connected to the negative output side of a high tension bridge rectifier 103 and the anode of 12 is connected to the positive output side of the same high tension bridge rectifier. 101 and 102 represent the high tension secondary windings of a single phase high tension transformer which drives 103. (For three phase systems there would be a comparable expansion of secondary connections and three phase full wave rectification would take place at 103.)

Full wave bridge 104 is connected in series with the mid-secondary of the high tension windings 101 and 102. Full wave bridge 104 is used to provide a unidirectional signal from the current flowing through the high tension secondary circuit.

The output of 104 is applied across points A and B of FIG. 6 in which:

IC-1 is a low power, low drift OP amplifier
IC-2 is a low power open collector comparator
IC-3 is a low power open collector comparator
IC-4 is a low power OP amplifier
IC-5 is a low power open collector comparator NOTE: The values given in the drawings and in the text are exemplary only.

Pulsed operation at output OUT-1 will occur if the D.C. input voltage level across R4 is less than +100 millivolts. The output pulse amplitude of 35 (OUT-1) is 100 millivolts and the duty factor of the pulses is directly proportional to the input DC level as a percentage of 100 millivolts. For example, 10 millivolts across R4:

$$\frac{\text{input}}{100} \times 100 = \frac{10}{100} \times 100\% = 10\% \text{ duty factor}$$

If the output signal is now taken and integrated, the average output level would be:

Pulse magnitude×duty factor=100 MV×10%=10 MV

Therefore, although the output is pulsed, the average output voltage is still directly proportional to the input voltage. The reasons for having pulsed output instead of a DC level for low input voltage are:

A: any circuit that is monitoring the output does not have extremely low DC signals to amplify. Minimum DC signal=100 millivolts For example—refer to FIG. 7

If the amplifier circuits after the scaling device had to contend with a 5 MV DC signal, for instance, the offset voltage drift of every OP amplifier used would be very critical.

Figure 7:
FIG. 7 is a block view of the amplifier circuit.

Referrng to FIG. 7

Input to amplifier chain=5 MV

Total offset drift appearing at output amplifier chain-5 MV

Since the output of the amplifier chain will be the input voltage±the offset voltage, it is quite possible that with +5 MV input the output of the amplifier chain could be: input MV+offset MV=5 MV+5 MV offset=10 MV or input+offset 5 MV+(−5 MV offset)=0

Therefore with a 5 MV input signal it is possible for the output of the amplifier chain to have an output of anywhere from 0-10 MV, depending on the direction of the offset drift.

It can therefore be seen that with conventional OP amps, it would be impossible to accurately reproduce very low signal levels.

Figure 8:
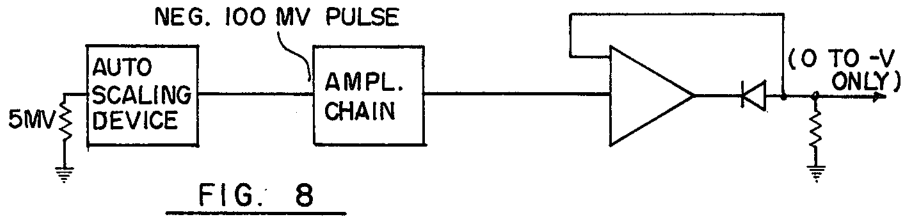
FIG. 8 is a view similar to FIG. 7 but with the Auto Scaling in circuit.

Referring to FIG. 8

However, if an Auto Scaling device is added ahead of the amplifier chain, and the output of the amplifier chain is single ended, this will allow the output signal to swing in only one direction.

It will now be seen how this Auto Scaling device makes conventional low cost amplifier chains accurate even with low input signals.

With 5 MV input the Auto Scaler puts out 100 MV pulses with 5% duty factor.

The amplifier chain still has a 5 MV offset drift. The offset adjustment of the amplifier chain is set such that, with 0 input volts, the output will not exceed ground potential in a negative direction at its maximum drift point. In other words, the offset adjustment is set such that with 0 MV input, the output will drift within the range of +5 MV to 0 MV.

The output of the single ended amplifier will ignore any positive going signal, and will only reproduce negative going input signals.

Analyzing the total operation and accuracy of this circuit, with 5 MV at Auto Scaling input, the output of the scaling device is −100 MV pulses with 5% duty factor.

The output of the amplifier chain will be anywhere from −95 to −100 MV pulses with 5% duty factor. The pulse amplitude will be input±offset drift of the amplifier chain.

Since the single ended output amplifier will ignore any signal that is positive with respect to ground, the output of this device will remain at 0 volts until the input signal is negative with respect to ground potential.

Therefore the output pulses from this circuit will be from −95 to −100 MV pulses at 5% duty factor. The elapsed time between pulses will be exactly 0 volts because the offset drift of the amplifier chain is adjusted so that it never goes negative with respect to ground, therefore the single ended amplifier ignores the offset drift between pulses.

ACCURACY OF SYSTEM

| | | | |
|---|---|---|---|
| 5 MV Input | Offset drift Max.<br>95 MV pulses 5% duty | Average Output<br>95 MV × 5% = 4.75 MV | Theoretical<br>Output 5 MV |
| 5 MV Input | Offset drift Min.<br>100 MV pulses 5% duty | Average Output<br>100 MV × 5% = 5 MV | 5 MV |
| 5 MV Input | Offset drift Average<br>97.5 MV pulses 5% duty | Average Output<br>97.5 MV × 5% = 4.875 MV | 5 MV |

With 5 MV in the total accuracy of the circuit is:

$$\frac{\text{Theoretical Output} - \text{Average Output}}{\text{Theoretical Output}} \times 100 = \%\text{ error}$$

$$\text{Max. Offset drift} = \frac{5\text{ MV} - 4.75}{5\text{ MV}} \times 100 = 5\%\text{ error}$$

$$\text{Min. drift} = \frac{5\text{ MV} - 5\text{ MV}}{5\text{ MV}} \times 100 = \frac{0}{5} \times 100 = 0\%\text{ error}$$

$$\text{Average drift} = \frac{5\text{ MV} - 4.875}{5} \times 100 = \frac{.125}{5} \times 100 = 2.5\%\text{ error}$$

It can therefore be seen that the maximum error of the total circuit is 5% with a 5 MV DC input signal.

Using the same circuit the maximum error with 1 MV will be as follows:

| | | | |
|---|---|---|---|
| IMV Input | Offset drift Max.<br>95 MV pulses 1% duty | Average Output<br>95 MV × 1% = .95 MV | Theoretical<br>Output 1 MV |
| IMV Input | Offset drift Min.<br>100 MV pulses 1% duty | 100 MV × 1% = 1 MV | 1 MV |

-continued

| | | | |
|---|---|---|---|
| IMV Input | Offset drift Average 97.5 MV pulses 1% duty | 97.5 MV × 1% = .975 MV | 1 MV |

Therefore, accuracy with 1 MV input is:

$$\text{Max. drift} = \frac{1 - .95}{1} \times 100 = \frac{.05}{1} \times 100 = 5\% \text{ error}$$

$$\text{Min. drift} = \frac{1 - 1}{1} \times 100 = \frac{0}{1} \times 100 = 0\% \text{ error}$$

$$\text{Average drift} = \frac{1 - .975}{1} \times 100 = \frac{.025}{1} \times 100 = 2.5\% \text{ error}$$

It will therefore be seen that even though the input MV signal is reduced from 5 MV to 1 MV, the maximum error of the total circuit has not changed percentages to maximum 5%.

The main conditions that will affect the accuracy of the total circuit at low input signals is the accuracy of the Auto Scale circuit and not the offset drift of the rest of the circuit.

B: The second reason for using the Auto Scale circuit is that this circuit will ignore any high frequency hash or noise that may be present on the input. The circuit will only reproduce the true positive going DC levels present at its input.

Figure 9A:
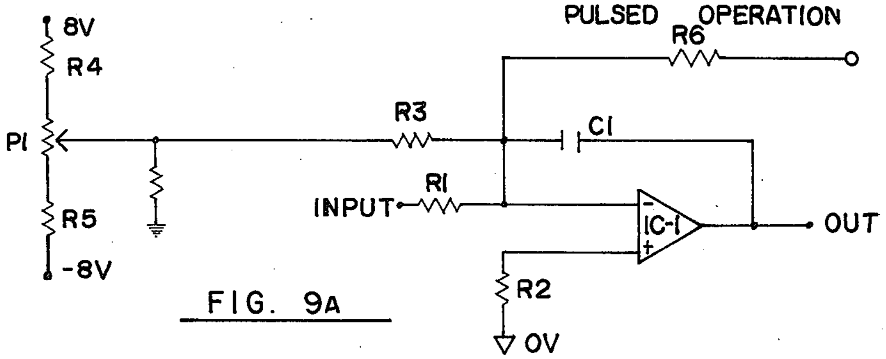
FIG. 9A is a schematic diagram showing part of the Auto Scaling device circuit.

Theory of Operation of the Auto Scale Device Pulsed Operation-refer to FIG. 9A

Referring to FIG. 9A, the first part of the Auto Scaler is essentially an integrator type of circuit. The only connection between the output of IC-1 and the inverting input thereof is through capacitor C1. The non-inverting input of IC-1 is restored to 0 volts through R2.

The inverting input of IC-1 has a total of four current sources.

1. Current proportional to input voltage through resistor R1.
2. Offset adjustment through resistor R3.
3. Opposing threshold current through resistor R6.
4. Rising or falling output current through C1.

With no current flow through R1 and R6, P1 (offset adjustment) is adjusted such that the output of IC-1 has the minimum voltage drift, in other words the offset is adjusted such that no offset current has to flow through capacitor C1.

Once the offset is properly adjusted, the charge or discharge rate of C1 is directly proportional to the sum of the currents through R1 and R6.

Figure 9B:
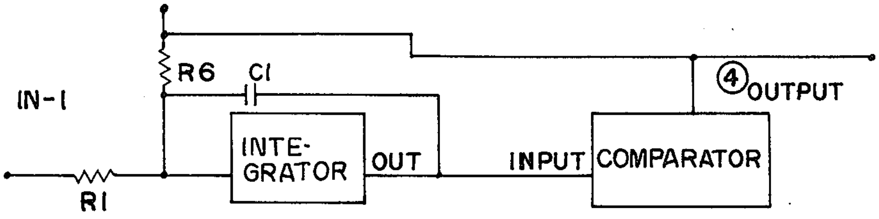
FIG. 9B is a schematic view showing part of the Auto Scaling device circuitry, including the circuitry of FIG. 9A.

Referring to FIG. 9B

The integrator block in FIG. 9B represents the circuitry covered in FIG. 9A.

The comparator block is actually a circuit that looks at the output voltage of the integrator block and switches in a current source when the output voltage of the integrator block tries to exceed −100 MV with respect to 0 volts. The output current source from the comparator block will then remain switched on until such time as the output from the integrator block swings back to 0 volts. Once the comparator output current source is switched off it will not turn on again until such time as the output voltage from the integrator block again exceeds. −100 MV.

When the current source is switched on, it will cause a 100 millivolt drop across resistor R6; this current through R6 will oppose any current through input resistor R1.

Therefore the charge rate of C1 when the output voltage of the integrator is on a negative swing but has not yet reached the −100 millivolt threshold of the comparator block, is directly proportional to the DC positive going input signal at IN-1.

When the output of the integrating block reaches −100 millivolts, the comparator block will switch in a current source through R6 to oppose the current through R1 (input resistor). If the input voltage at IN-1 is lower than 100 MV, the net result will be that capacitor C1 will discharge from −100 MV toward "0" MV. The rate of discharge of capacitor C1 is directly proportional to the net difference of currents through R6 and R1.

Therefore during pulsed operation or low input voltage the charge and discharge rate of C1 can be interpreted as such:

Legend:

$I_1$=current through resistor R1

$I_6$=current through resistor R6

Th-1=OV or threshold where comparator block will switch "off" its current source.

Th-2=100 MV or threshold where comparator block will switch "on" its current source.

Discharge or charge rate of C1=$(I_1+I_6)\times 1$ sec.=V×C1

Charge rate:

since $I_6$ is 0 during charging the charge formula can then be interpreted as:

$I_1 \times 1$ sec.=V×C1 in farads

Placing values to R1, R6 and C1 for purposes of calculating the operation of this circuit, Let R6 be 10k Let R1 be 10k Let C1 be 1MFD.

Value of input voltage=10 MV at IN-1

C1 Charge Rate/sec.=$[I_1=(I_6=0)]\times 1$ sec.=V×C1

$$\text{Now, } I_1 = \frac{.01\text{V}}{1000\Omega} = .000001 \text{ amp, and } C1 = .000001\,fd$$

$$\text{Therefore } C1 \text{ charge rate} = .000001 \times 1 \text{ sec.} =$$

$$(\text{V}) \times .000001\,fd \text{ so V} = \frac{.000001}{.000001} = 1\text{V across } C1\text{, and}$$

C1 charge rate=1 V/sec.

C1 Discharge Rate=$(I_1+I_6)\times 1$ sec.=(V)×0.000001fd $I_1$=0.000001 amp $I_6$=−0.00001 amp $$C1 \text{ Discharge Rate} = .000001 + (-.00001) \times 1 \text{ sec.} = \text{V} \times$$

$$.000001\,fd - .000009 \times 1 \text{ sec.} = \text{V} \times .000001\ \frac{.000009 \times 1 \text{ sec.}}{.000001} =$$

$$\text{V} = 9\text{V, so}$$

C1 Discharge Rate=9 V/sec.

$$\text{Charge Time to reach } Th\text{-}2 \text{ or } 100\ MV\ \frac{Th\text{-}2}{\text{Rate}} = \frac{.1}{1\text{V/sec.}} = .1 \text{ sec. or } 100\ MS$$

Discharge Time to go from $Th\text{-}2 = 100\ MV$ to $Th\text{-}1 = 0$ $$\frac{.1}{1\text{V/sec.}} = .01111 \text{ sec. or } 11.111\ MS$$

Duty Factor =

$$\frac{\text{Discharge Time}}{\text{Discharge Time} + \text{Charge Time}(= \text{Total Cycle Time})} = \frac{.01111}{.01111 + .1} = \frac{.01111}{.11111} = .1$$

Duty Factor = .1 or 10%

If the duty factor is not multiplied by the output voltage of the comparator block (−100 MV when comparator is turned on), the average output voltage would be (Pulse Amplitude×Duty Factor)=100 MV×10%=10 MV average output.

Figure 10:
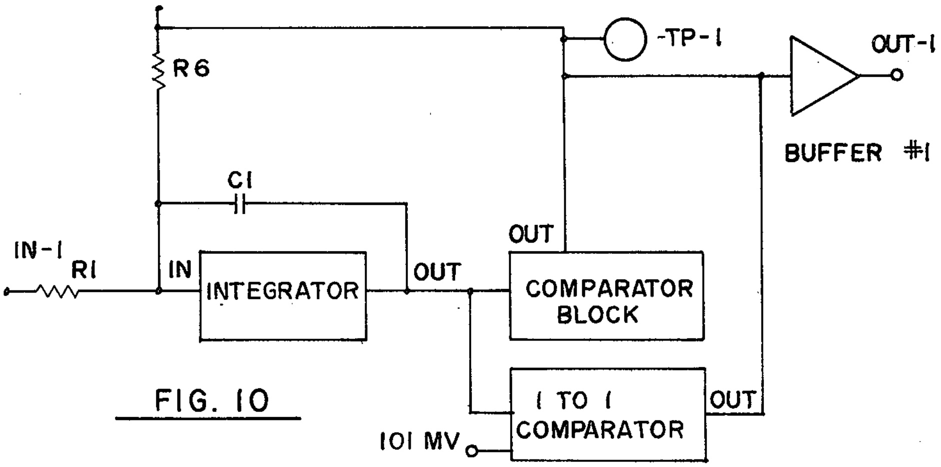
FIG. 10 is a block diagram of the Auto Scaling circuit.

Theory of Operation of Auto Scaling Device-Analog Operation-refer to FIG. 10

If the input voltage at IN-1 exceeds +100 MV, C1 will keep charging even after the comparator block has turned on, because the current through R1 will still be greater than the opposing current through R6.

When the charge on C1 tries to exceed −101 MV, the 1 to 1 comparator will switch in an opposing current source that will add to the current source of the comparator block. Therefore, C1 will not be allowed to charge beyond −101 MB because the 1 to 1 comparator will switch in enough opposing current to hold C1 to a maximum of −101 MV.

Therefore, when the input voltage at IN-1 exceeds 100 MV the current source from comparator block in conjunction with the current source from the 1 to 1 comparator will exactly match and oppose the current passing through input resistor R1.

Therefore, the voltage drop across R6 will be equal to but opposite polarity to the voltage drop across input resistor R1. Therefore, the voltage at TP1 is equal to but opposite polarity to the input voltage.

Buffer #1 is a unity gain buffer amplifier that amplifies the signal at TP1 and allows a low impedance output. Therefore for signals higher than 100 MV at IN-1, the output signal at OUT-1 is equal to the input voltage (1 to 1 gain).

For input signals lower than 100 MV at IN-1, 100 MV output pulses will appear at OUT-1, but the average voltage at OUT-1 will still be equal to the DC input voltage.

Figure 12:
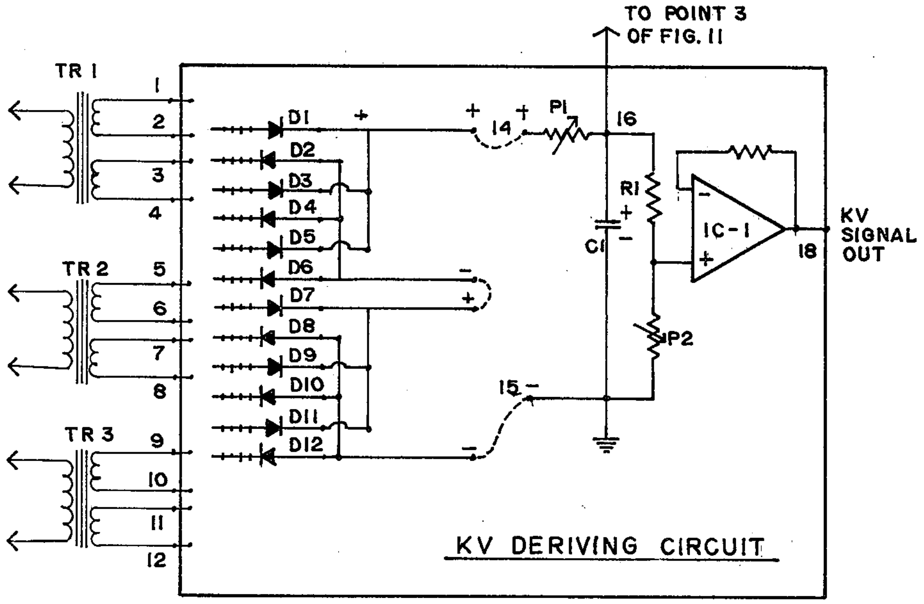
FIG. 12 is a schematic diagram of the KV deriving circuit.

Referring to FIG. 12 (KV Deriving Circuits

This circuit can be used alone or in conjunction with the MA deriving circuit (FIG. 11).

FIG. 12 shows a schematic view of a preferred method of deriving a KV signal which is proportional to but isolated from the actual kilovoltage or KV wave form, that appears across the X-ray tube during an X-ray exposure.

The primary windings of Tr1, Tr2, and Tr3 are wired to the primary windings of the X-ray system's high tension transformer. If the X-ray system is single phase, only Tr1 is required, on the other hand, if the X-ray system is three phase, Tr1, Tr2 and Tr3 are necessary.

The secondary windings of Tr1, Tr2 and Tr3 are then connected to a circuit board on which twelve rectifiers are mounted (D1 to D12 inclusive). By using a system of jumper wires it is then relatively easy to connect the secondary windings Tr1, Tr2 and Tr3 in such a fashion that they will match the type of rectification used in the high tension rectification circuit of the X-ray system. The DC legs of the Rectifier Bank (D1 to D12 inclusive) can then be jumped to points (14+ and 15−. FIG. 12 shows the most common way of jumping these points.

The voltage appearing between points 14+ and 15− will then be a voltage proportional to but isolated from the no-load kilovoltage that would appear across the X-ray tube of the X-ray system with a given AC voltage(s) applied to the high tension transformer primary windings. Point 14+ is then connected to the positive side of C1 (point 16) through potentiometer P1. IC-1 then monitors the voltage across C1 capacitor by means of a voltage divider comprising R1 and P2. P2 of the said voltage divider is adjusted to match the turns ratio of the high tension transformer in question. Point 16 is then connected to the collector of the MA current source transistor T1 (of FIG. 11) via point 3 (of FIG. 11). Therefore, T1 transistor (FIG. 11) will load down the DC voltage at point 16 in a similar fashion as the X-ray tube loads down the high tension circuit of the X-ray system. P1 resistor is then adjusted to match the impedance of the high tension circuit in question. C1 capacitor is used to simulate the overall capacitance of the high tension circuit in question.

This device provides accurate and safe means of monitoring KV waveforms. No high voltage measuring devices such as the G.E. high voltage divider or the Machlett Dynalizer are needed. Since the KV deriving circuit reproduces a KV signal which very closely approximates the actual KV waveform, a maximum amount of information can be measured from the signal, as the ouput signal at point 18 very closely approximates (in a scaled down version), the actual KV waveform appearing across the X-ray tube during exposure.

For example, KV Peak can be measured, Average KV can be measured, and if this KV signal is fed into a multiplier along with an MA signal, these two signals can be multiplied in real time and consequently this multiplier can have an output signal which represents the real time product (kilowattage) of the KV and MA signal.

The basic concept of this circuit is to reproduce as closely as possible the events happening in the high tension circuit of the X-ray generator system during an X-ray exposure.

The best way of realizing the above mentioned concept is to reproduce, as closely as possible, the circuitry that is present in the high tension circuit of the X-ray generator being monitored. The most important parameters and circuits to match are listed below:

1. Voltage on the high tension primary winding(s).
2. Turn ratio of the high tension transformer(s).
3. Impedance of the high tension circuit.
4. Capacity of the high tension circuit.
5. Loading effects on the high tension circuit.
6. Methods of high tension rectification.
7. Number of phases the X-ray generator operates on, for example, single phase, 3 phase.

The KV deriving circuits take into account all of the vital points that are needed to accurately produce a simulated KV waveform, as follows:

1. Referring to FIG. 12: Tr1, Tr2 and Tr3 are used to isolate and monitor the primary volts on the high tension transformer(s).
2. Potentiometer P2 is adjusted to match the turns ratio of the high tension transformer(s).
3. Potentiometer P1 is adjusted to match the impedance of the high tension circuit.
4. The value of capacitor C1 is chosen to match the capacity of the high tension circuit.
5. A current source proportional to the MA flowing through the X-ray tube may be taken from the MA deriving circuit, FIG. 11 point 3, and injected in the KV deriving circuit, FIG. 12 point 16. This loads down the KV simulating circuit in the same manner as the X-ray tube current loads down the high tension circuit of the X-ray system. Note: Other current sources proportional to the MA flowing through the X-ray tube could also be used instead of the above mentioned current sources.
6. D1 through D12 can be programmed to exactly match the method of rectification used in the high tension circuit.
7. Since Tr1, Tr2 and Tr3 are separate transformers, it is possible to monitor the primary volts of up to three different high tension transformer primaries. All three transformers (Tr1, Tr2, Tr3) are needed on 3 phase X-ray generators. Only Tr1 is needed when monitoring single phase generators.

In conclusion, the KV deriving circuit is believed to be the only circuit that takes into account all of the crucial points required to accurately simulate a KV signal proportional to the KV signal across an X-ray tube during an X-ray exposure. This circuit is designed for maximum safety as well as real time accuracy.

It will be appreciated that this circuit can, if desired, be provided as an individual instrument module connectable to any X-ray machine and can be provided with or selectively attached to a variety of information read-out devices including microprocessors, memory devices and the like.

Figure 13:
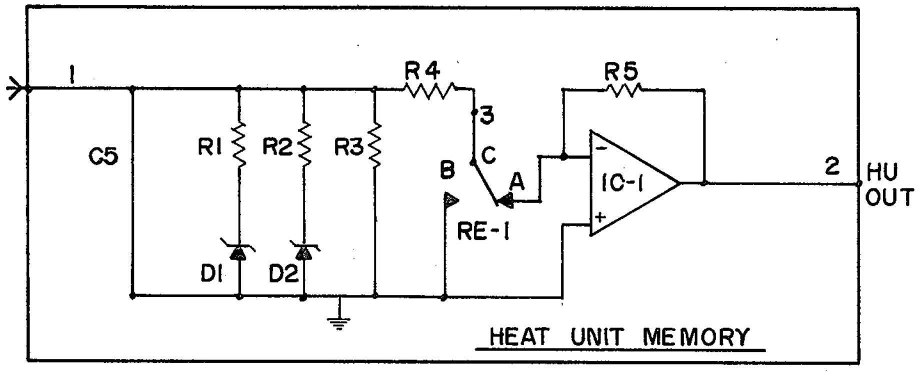
FIG. 13 is a schematic diagram of the heat unit memory circuit.

Referring to FIG. 13

FIG. 13 shows a preferred schematic of a heat unit memory circuit.

During an X-ray exposure, a current corresponding to the KV×MA product of the X-ray exposure will charge capacitor C5 via point 1. Therefore, the charge rate of capacitor C5 will be directly proportional to the rise in temperature of the X-ray tube anode during an X-ray exposure. Resistors R1, R2, R3 and R4 in conjunction with diodes D1 and D2 form the discharge path for C5. Diodes D1 and D2 are used if a discharge curve other than an exponential curve is desired.

IC-1 monitors the voltage on C5 via closed contact of RE-1(C-A) when power supplies are energized. Since the non-inverting input of IC-1 OP amp is referenced to ground potential, the inverting input of IC-1 is also at ground potential by virtue of the feedback current through R5. Since RE-1 A and C contacts are shorted, point 3 is, for all practical purposes, also at ground potential.

When power is removed from the power supplies RE-1 A and C contacts open and RE-1 C and B contacts short. This will revert point 3 to ground potential through closed contacts RE-1 (C-B).

In other words, the discharge path of C5 which included R4 is the same whether power is on or off. This memory circuit can simulate the cooling of the X-ray tube anode in a non-volatile fashion.

Other means of producing non-volatile memories would be to use auxiliary battery supplies when power is removed from the power supplies.

Figure 14:
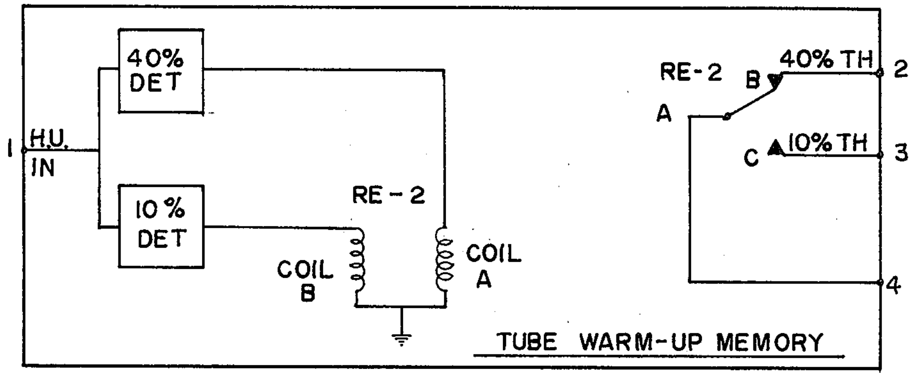
FIG. 14 is a schematic diagram of the tube warm-up memory circuit.

Referring to FIG. 14

FIG. 14 shows a schematic view of a preferred circuit for a non-volatile tube warm-up memory.

RE-2 is a latching relay with two coils (coil A+Coil B).

When coilA is energized, RE-2 A and C contacts short.

Point 2 has a DC voltage corresponding to 40% H.U.

Point 3 has a DC voltage corresponding to 10% H.U.

Point 1 has a DC voltage corresponding to the heat units stored in the anode of the X-ray tube in question at any given time.

The Point 2 and 3 thresholds are practical values given by way of example; the values will be adjustable in an actual system.

If the heat unit signal at point 1 corresponds to less than 10% H.U., the 10% detector will activate coil B of RE-2. This will in turn short contacts A and B of RE-2. The voltage at point 4 will determine at what level the cold anode safety relay circuit will start allowing high magnitude X-ray exposures. With contacts A and B of RE-2 closed, the cold anode safety relay circuit will only allow high magnitude X-ray exposure after the X-ray tube has exceeded 40% heat units.

Once the heat units at point 1 have exceeded 40%, the 40% detector will energize coil A. This will open A and B contacts of RE-2 and close contacts A and C. This will switch the voltage at point 4 from 40% threshold to 10% threshold. In other words, the cold anode safety relay circuit will allow high magnitude X-ray exposures until the heat units stored on the anode of the X-ray tube in question fall below 10% heat units.

Since RE-2 uses mechanical latching it will remain at its last position if power is removed from the circuit. Therefore this is a non-volatile warm-up memory.

Other means of producing non-volatile memories would be to use auxiliary battery power supplies when power is removed from the circuit.

Switching Signals and Isolation Circuits

Figure 15:
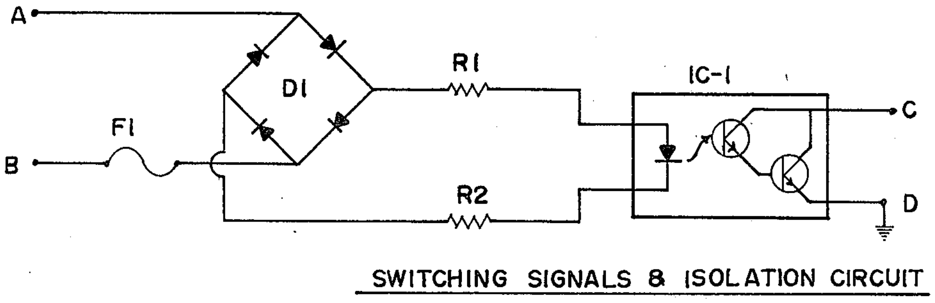
FIG. 15 is a schematic diagram of the switching signals and isolation circuits.

FIG. 15 shows a preferred way of detecting and electrically isolating signals from the X-ray system such as tube select signals, rotor speed signals, focal spot size signals, etc.

All values given are for reference only.

Theory of Operation

When a signal voltage appears between point A and point B, a current will flow from point A, through D1, through R1, through LED in IC-1 Opto isolator through R2, through D1, through F1 fuse to point B.

Full wave bridge rectifier D1 serves the purpose of rectifying the signal current and directing it via R1 and R2 to the LED of IC-1 in such a fashion as to forward bias the LED in IC-1. Therefore this circuit will recognize or accept either an AC signal or a DC signal.

Assume that with 2MA of current passing through IC-1's LED, the output transistors of IC-1 are conducting enough to initiate the desired switching actions between points C and D.

Further, assume the IC-1's LED is also capable of accepting up to 75MA of continuous current.

Therefore it is now conceivable that any current from 2MA to 75MA through IC-1's LED would cause the desired switching action across points C and D.

Now assume that D1 bridge rectifier is capable of conducting up to 1 amp and its maximum reverse voltage is 1000 volts.

Now assume values for R1 and R2 such that 24 volts AC or DC between points A and B would cause DC current of 2MA through IC-1's LED.

If 24 volts across points A and B cause 2MA to flow through IC-1's LED it is then logical that it would take approximately (75MA/2MA) or 37.5 times as much signal voltage at points A and B to cause the maximum safe current through IC-1's LED (75MA).

NOTE: The exact ratio between minimum and maximum input signal levels would have to be calculated with the forward voltage drop of D1's diodes and IC-1's LED taken into account.

For the sake of example, it is assumed that a maximum signal of 30 times the minimum signal could be achieved.

Therefore input signals from 24 volts AC or DC to input signals up to $(30\times24)=720$ volts AC or DC could be applied across points A and B to achieve the desired switching effect across points C and D.

The only other limiting factors for maximum signal levels appearing across points A and B are the wattages of R1 and R2, and the ability of the circuit feeding point A and B to supply enough current.

Since points A and B have no electrical connection to ground potential, they can be hooked up to floating signals from the X-ray system.

The limiting factor for the floating signals would then be the electrical isolation capabilities of IC-1 optoisolator and the circuit board and interconnection isolation capabilities. A practical isolation factor would be $\pm$ 1 KV from ground potential for example.

Since the output of IC-1 is electrically isolated from the input circuitry, it is then possible to ground point D and connect point C to the low voltage circuits of the heat unit indicator.

By using this system of isolation it is then possible to interface it with practically all types of X-ray systems with no change to the input circuitry of the switching signals detector and isolation circuits.

It will of course be appreciated that although the circuits described and illustrated are analogue circuit, nevertheless digital equivalents are intended to be included in the specification and attached claims.

Since various modifications can be made in my invention as hereinabove described, and many apparently widely different embodiments of same made within the spirit and scope of the claims without departing from such spirit and scope, it is intended that all matter contained in the accompanying specification shall be interpreted as illustrative only and not in a limiting sense.

What I claim as my invention is:

1. A signal derivation circuit for use with X-ray systems which include an X-ray tube, and at least one high tension transformer having at least one primary winding and at least one secondary winding, with the secondary winding being operatively connected to the X-ray tube, said signal derivation circuit consisting of a KV circuit operatively connected to the primary voltage of the X-ray high tension transformer of the X-ray tube for providing a KV signal that is proportional to but isolated from the KV waveform or signal present across the X-ray tube during operation thereof: said signal derivation circuit comprising in combination a KV circuit having at least one isolation transformer, said isolation transformer having a primary winding and a secondary winding, said primary winding of said isolation transformer being operatively connectable to the primary winding of the high tension transformer of the X-ray system, to monitor and isolate the voltage waveform characteristics of the high tension transformer primary winding, and adjustable means in said KV circuit to match, within limits, the actual operating characteristics of the high tension circuit including the X-ray tube during operation thereby to simulate the KV signal across said X-ray tube during operation, said KV circuit including means operatively connected to the secondary winding of said isolation transformer to match substantially, the type of rectification used in the X-ray system being monitored, means to match substantially, the turns ratio of the high tension transformer of the X-ray system and means to match substantially, the impedance of the high tension circuit of the X-ray system to provide an output signal circuit, a capacitor across said output signal circuit to match substantially, the capacity of said secondary circuit of said high tension transformer, a circuit for providing a simulated KV signal output and a voltage divider circuit in parallel relationship with said capacitor and being operatively connected to said circuit.

2. The device according to claim 1 in which said means operatively connected to the secondary circuit of said isolation transformer to match substantially, the type of rectification used, includes a rectifier bank operatively connected to the secondary circuit of the isolation transformer and being operatively connected to said output signal circuit.

3. The device according to claim 1 in which said means to match substantially, the turns ratio of the high tension transformer of the X-ray tube includes an adjustable potentiometer in said voltage divider circuit.

4. The device according to claim 2 in which said means to match substantially, the turns ratio of the high tension transformer of the X-ray tube includes an adjustable potentiometer in said voltage divider circuit.

5. The device according to claim 1 in which said means to match substantially, the impedance of the high tension transformer of the X-ray circuit, includes an adjustable potentiometer in the positive output signal circuit.

6. The device according to claim 2 in which said means to match substantially, the impedance of the high tension transformer of the X-ray circuit, includes an adjustable potentiometer in the positive output signal circuit.

7. The device according to claim 3 in which said means to match substantially, the impedance of the high tension transformer of the X-ray circuit, includes an adjustable potentiometer in the positive output signal circuit.

8. The device according to claim 4 in which said means to match substantially, the impedance of the high tension transformer of the X-ray circuit, includes an adjustable potentiometer in the positive output signal circuit.

9. The device according to claim 2 in which said rectifier bank is programmable to match substantially the type of rectification used in the X-ray system.

10. The device according to claim 4 in which said rectifier bank is programmable to match substantially the type of rectification used in the X-ray system.

11. The device according to claim 6 in which said rectifier bank is programmable to match substantially the type of rectification used in the X-ray system.

12. The device according to claim 8 in which said rectifier bank is programmable to match substantially the type of rectification used in the X-ray system.

13. The device according to claims 1 or 2 which includes a current source proportional to the milliamperes flowing through said X-ray tube, said current source being operatively connected to and injected into said KV deriving circuit, to load down the KV simulating circuit via an amount substantially proportional and in proper scale relationship to the amount the high tension circuit of said X-ray circuit is loaded down by the X-ray tube current loads.

14. The device according to claims 3, 4 or 5 which includes a current source proportional to the milliamperes flowing through said X-ray tube, said current source being operatively connected to and injected into said KV deriving circuit, to load down the KV simulating circuit via an amount substantially proportional and in proper scale relationship to the amount the high tension circuit of said X-ray circuit is loaded down by the X-ray tube current loads.

15. The device according to claims 6, 7 or 8 which includes a current source proportional to the milliamperes flowing through said X-ray tube, said current source being operatively connected to and injected into said KV deriving circuit, to load down the KV simulating circuit via an amount substantially proportional and in proper scale relationship to the amount the high tension circuit of said X-ray circuit is loaded down by the X-ray tube current loads.

16. The device according to claims 9, 10 or 11 which includes a current source proportional to the milliamperes flowing through said X-ray tube, said current source being operatively connected to and injected into said KV deriving circuit, to load down the KV simulating circuit via an amount substantially proportional and in proper scale relationship to the amount the high tension circuit of said X-ray circuit is loaded down by the X-ray tube current loads.

17. The device according to claim 12 which includes a current source proportional to the milliamperes flowing through said X-ray tube, said current source being operatively connected to and injected into said KV deriving circuit, to load down the KV simulating circuit via an amount substantially proportional and in proper scale relationship to the amount the high tension circuit of said X-ray circuit is loaded down by the X-ray tube current loads.

18. The device according to claims 1 or 2 which includes a current source proportional to the milliamperes flowing through said X-ray tube, said current source being operatively connected to and injected into said KV deriving circuit, to load down the KV simulating circuit via an amount substantially proportional and in proper scale relationship to the amount the high tension circuit of said X-ray circuit is loaded down by the X-ray tube current loads, said current source including a milliampere circuit operatively connected to the midpoint of the secondary winding of the high tension transformer of the X-ray tube circuit thereby providing a signal that is proportional to the milliamperes flowing through said midpoint of said secondary winding of said high tension transformer.

19. The device according to claims 3, 4 or 5 which includes a current source proportional to the milliamperes flowing through said X-ray tube, said current source being operatively connected to and injected into said KV deriving circuit, to load down the KV simulating circuit via an amount substantially proportional and in proper scale relationship to the amount the high tension circuit of said X-ray circuit is loaded down by the X-ray tube current loads, said current source including a milliampere circuit operatively connected to the midpoint of the secondary winding of the high tension transformer of the X-ray tube circuit thereby providing a signal that is proportional to the milliamperes flowing through said midpoint of said secondary winding of said high tension transformer.

20. The device according to claims 6, 7 or 8 which includes a current source proportional to the milliamperes flowing through said X-ray tube, said current source being operatively connected to and injected into said KV deriving circuit, to load down the KV simulating circuit via an amount substantially proportional and in proper scale relationship to the amount the high tension circuit of said X-ray circuit is loaded down by the X-ray tube current loads, said current source including a milliampere circuit operatively connected to the midpoint of the secondary winding of the high tension transformer of the X-ray tube circuit thereby providing a signal that is proportional to the milliamperes flowing through said midpoint of said secondary winding of said high tension transformer.

21. The device according to claims 9, 10 or 11 which includes a current source proportional to the milliamperes flowing through said X-ray tube, said current source being operatively connected to and injected into said KV deriving circuit, to load down the KV simulating circuit via an amount substantially proportional and in proper scale relationship to the amount the high tension circuit of said X-ray circuit is loaded down by the X-ray tube current loads, said current source including a milliampere circuit operatively connected to the midpoint of the secondary winding of the high tension transformer of the X-ray tube circuit thereby providing a signal that is proportional to the milliamperes flowing through said midpoint of said secondary winding of said high tension transformer.

22. The device according to claim 12 which includes a current source proportional to the milliamperes flowing through said X-ray tube, said current source being operatively connected to and injected into said KV deriving circuit, to load down the KV simulating circuit via an amount substantially proportional and in proper scale relationship to the amount the high tension circuit of said X-ray circuit is loaded down by the X-ray tube current loads, said current source including a milliampere circuit operatively connected to the midpoint of the secondary winding of the high tension transformer of the X-ray tube circuit thereby providing a signal that is proportional to the milliamperes flowing through said midpoint of said secondary winding of said high tension transformer.

23. A signal derivation circuit for use with X-ray systems having a plurality of X-ray tubes, said systems also including a plurality of high tension transformers each having at least one primary winding and at least one secondary winding or an equivalent multi-purpose transformer, the primary windings of the respective high tension transformers being operatively connected to the respective input phases, with the secondary winding being operatively connected to the X-ray tubes, said signal derivation circuit consisting of a KV circuit operatively connected to the primary voltage of the X-ray high tension transformer of the X-ray tube for providing a voltage signal that is proportional to but isolated from the voltage waveform or signal present across the primary windings of the high tension transformers; said signal derivation circuit comprising in combination a KV circuit having at least one isolation transformer, said isolation transformer having a primary winding and a secondary winding, said primary winding of said isolation transformer being operatively connectable to the primary windings of the high tension transformers of the X-ray system, to monitor the voltage waveform characteristics of the high tension transformer primary windings, adjustable means in said KV circuit to match, within limits, the operating characteristics of the high tension circuit including the X-ray tube during operation thereby to simulate the KV signal, across said X-ray tubes during operation, said KV circuit including means operatively connected to the secondary winding of said isolation transformer to match substantially, the type of rectification used in the X-ray system being monitored, means to match substantially, the turns ratio of the high tension transformer of the X-ray system and means to match substantially, the impedance of the high tension circuit of the X-ray system to provide an output signal circuit, a capacitor across said output signal circuit to match substantially, the capacity of said secondary circuit of said high tension transformer, a circuit for providing a simulated KV signal output and a voltage divider circuit in parallel relationship with said capacitor and being operatively connected to said circuit.

24. The device according to claim 23 in which said means operatively connected to the secondary circuit of said isolation transformer to match substantially, the type of rectification used, includes a rectifier bank operatively connected to the secondary circuit of the isolation transformer and being operatively connected to said output signal circuit.

25. The device according to claim 23 in which said means to match substantially, the turns ratio of the high tension transformer of the X-ray tube includes an adjustable potentiometer in said voltage divider circuit.

26. The device according to claim 26 in which said means to match substantially, the turns ratio of the high tension transformer of the X-ray tube includes an adjustable potentiometer in said voltage divider circuit.

27. The device according to claim 23 in which said means to match substantially, the impedance of the high tension transformer of the X-ray circuit, includes an adjustable potentiometer in the positive output signal circuit.

28. The device according to claim 24 in which said means to match substantially, the impedance of the high tension transformer of the X-ray circuit, includes an adjustable potentiometer in the positive output signal circuit.

29. The device according to claim 25 in which said means to match substantially, the impedance of the high tension transformer of the X-ray circuit, includes an adjustable potentiometer in the positive output signal circuit.

30. The device according to claim 26 in which said means to match substantially, the impedance of the high tension transformer of the X-ray circuit, includes an adjustable potentiometer in the positive output signal circuit.

31. The device according to claim 24 in which said rectifier bank is programmable to match substantially the type of rectification used in the X-ray system.

32. The device according to claim 26 in which said rectifier bank is programmable to match substantially the type of rectification used in the X-ray system.

33. The device according to claim 28 in which said rectifier bank is programmable to match substantially the type of rectification used in the X-ray system.

34. The device according to claim 30 in which said rectifier bank is programmable to match substantially the type of rectification used in the X-ray system.

35. The device according to claims 23 or 24 which includes a current source proportional to the milliamperes flowing through said X-ray tube, said current source being operatively connected to and injected into said KV deriving circuit, to load down the KV simulating circuit via an amount substantially proportional and in proper scale relationship to the amount the high tension circuit of said X-ray circuit is loaded down by the X-ray tube current loads.

36. The device according to claims 25, 26 or 27 which includes a current source proportional to the milliamperes flowing through said X-ray tube, said current source being operatively connected to and injected into said KV deriving circuit, to load down the KV simulating circuit via an amount substantially proportional and in proper scale relationship to the amount the high tension circuit of said X-ray circuit is loaded down by the X-ray tube current loads.

37. The device according to claims 28, 29 or 30 which includes a current source proportional to the milliamperes flowing through said X-ray tube, said current source being operatively connected to and injected into said KV deriving circuit, to load down the KV simulating circuit via an amount substantially proportional and in proper scale relationship to the amount the high tension circuit of said X-ray circuit is loaded down by the X-ray tube current loads.

38. The device according to claims 31, 32 or 33 which includes a current source proportional to the milliamperes flowing through said X-ray tube, said current source being operatively connected to and injected into said KV deriving circuit, to load down the KV simulating circuit via an amount substantially proportional and in proper scale relationship to the amount the high tension circuit of said X-ray circuit is loaded down by the X-ray tube current loads.

39. The device according to claim 34 which includes a current source proportional to the milliamperes flowing through said X-ray tube, said current source being operatively connected to and injected into said KV deriving circuit, to load down the KV simulating circuit via an amount substantially proportional and in proper scale relationship to the amount the high tension circuit of said X-ray circuit is loaded down by the X-ray tube current loads.

40. The device according to claims 23 or 24 which includes a current source proportional to the milliamperes flowing through said X-ray tube, said current source being operatively connected to and injected into said KV deriving circuit, to load down the KV simulating circuit via an amount substantially proportional and in proper scale relationship to the amount the high tension circuit of said X-ray circuit is loaded down by the X-ray tube current loads, said current source including a milliampere circuit operatively connected to the midpoint of the secondary winding of the high tension transformer of the X-ray tube circuit thereby providing a signal that is proportional to the milliamperes flowing through said midpoint of said secondary winding of said high tension transformer.

41. The device according to claims 25, 26 or 27 which includes a current source proportional to the milliamperes flowing through said X-ray tube, said current source being operatively connected to and injected into said KV deriving circuit, to load down the KV simulating circuit via an amount substantially proportional and in proper scale relationship to the amount the high tension circuit of said X-ray circuit is loaded down by the X-ray tube current loads, said current source including a milliampere circuit operatively connected to the midpoint of the secondary winding of the high tension transformer of the X-ray tube circuit thereby providing a signal that is proportional to the milliamperes flowing through said midpoint of said secondary winding of said high tension transformer.

42. The device according to claims 28, 29 or 30 which includes a current source proportional to the milliamperes flowing through said X-ray tube, said current source being operatively connected to and injected into said KV deriving circuit, to load down the KV simulating circuit via an amount substantially proportional and in proper scale relationship to the amount the high tension circuit of said X-ray circuit is loaded down by the X-ray tube current loads, said current source including a milliampere circuit operatively connected to the midpoint of the secondary winding of the high tension transformer of the X-ray tube circuit thereby providing a signal that is proportional to the milliamperes flowing through said midpoint of said secondary winding of said high tension transformer.

43. The device according to claims 31, 32 or 33 which includes a current source proportional to the milliamperes flowing through said X-ray tube, said current source being operatively connected to and injected into said KV deriving circuit, to load down the KV simulating circuit via an amount substantially proportional and in proper scale relationship to the amount the high tension circuit of said X-ray circuit is loaded down by the X-ray tube current loads, said current source including a milliampere circuit operatively connected to the midpoint of the secondary winding of the high tension transformer of the X-ray tube circuit thereby providing a signal that is proportional to the milliamperes flowing through said midpoint of said secondary winding of said high tension transformer.

44. The device according to claim 34 which includes a current source proportional to the milliamperes flowing through said X-ray tube, said current source being operatively connected to and injected into said KV deriving circuit, to load down the KV simulating circuit via an amount substantially proportional and in proper scale relationship to the amount the high tension circuit of said X-ray circuit is loaded down by the X-ray tube current loads, said current source including a milliampere circuit operatively connected to the midpoint of the secondary winding of the high tension transformer of the X-ray tube circuit thereby providing a signal that is proportional to the milliampere flowing through said midpoint of said secondary winding of said high tension transformer.

45. The device according to claims 1 or 23 which includes control means operatively connected between said output means and the associated X-ray system for controlling the operation of said system if certain preset parameters are equalled or exceeded.

46. The device according to claims 1 or 23 which includes an auto-scaling device operatively connected to the current source proportional to the milliamperes flowing through said X-ray tube for automatically extending the dynamic range of the milliampere deriving currents and retaining the accuracy of the total circuit at low input signals.

* * * * *